United States Patent [19]

Imamura

[11] Patent Number: 5,679,234

[45] Date of Patent: Oct. 21, 1997

[54] PROCESS OF FORMING MINIATURE PATTERN WELL CONTROLLED IN THICKNESS ON SEMICONDUCTOR WAFER THROUGH SELECTIVE ELECTROPLATING

[75] Inventor: Takafumi Imamura, Tokyo, Japan

[73] Assignee: NEC Corporation, Tokyo, Japan

[21] Appl. No.: 530,424

[22] Filed: Sep. 19, 1995

[30] Foreign Application Priority Data

Sep. 21, 1994 [JP] Japan ................................ 6-251535

[51] Int. Cl.⁶ .............................. C25D 5/02; C25D 5/54;
C25D 28/02; H01L 21/465
[52] U.S. Cl. ...................... 205/123; 205/124; 205/157;
205/159; 205/164; 205/165; 205/166; 205/167;
205/189; 205/186; 205/187; 205/188; 204/192.34;
437/228 M; 437/228 I; 437/40 GS; 437/41 GS;
437/230; 437/246
[58] Field of Search ...................... 205/123, 159,
205/162, 163, 164, 165, 166, 167, 184,
186, 187, 188, 189, 205, 124, 157; 204/192.34;
437/228 M, 228 I, 40 GS, 41 GS, 230,
246

[56] References Cited

U.S. PATENT DOCUMENTS 4,897,361  1/1990  Harriott et al. .................... 437/228 M
4,963,512  10/1990  Iwanaga et al. ........................ 437/230
5,296,399  3/1994  Park .......................................... 437/52

FOREIGN PATENT DOCUMENTS 4-93030   3/1992  Japan .

OTHER PUBLICATIONS

IBM Technical Disclosure Bulletin, vol. 31, No. 6, p. 488, Nov. 1988.

Reinken, "Rectifiers", Electroplating Engineering Handbook, 2nd ed., pp. 666–673, ?1962.

Primary Examiner—Kathryn Gorgos
Assistant Examiner—Edna Wong
Attorney, Agent, or Firm—Foley & Lardner

[57] ABSTRACT

A mask layer is formed on a conductive layer covering not only a central area assigned to integrated circuits but also a vacant peripheral area of a semiconductor wafer, and an electroplating system allows metallic miniature patterns to grow on the conductive layer over the vacant peripheral area as well as extremely small areas of the conductive layer over the central area so as to make current fluctuation negligible.

14 Claims, 5 Drawing Sheets

Fig. 1A
PRIOR ART
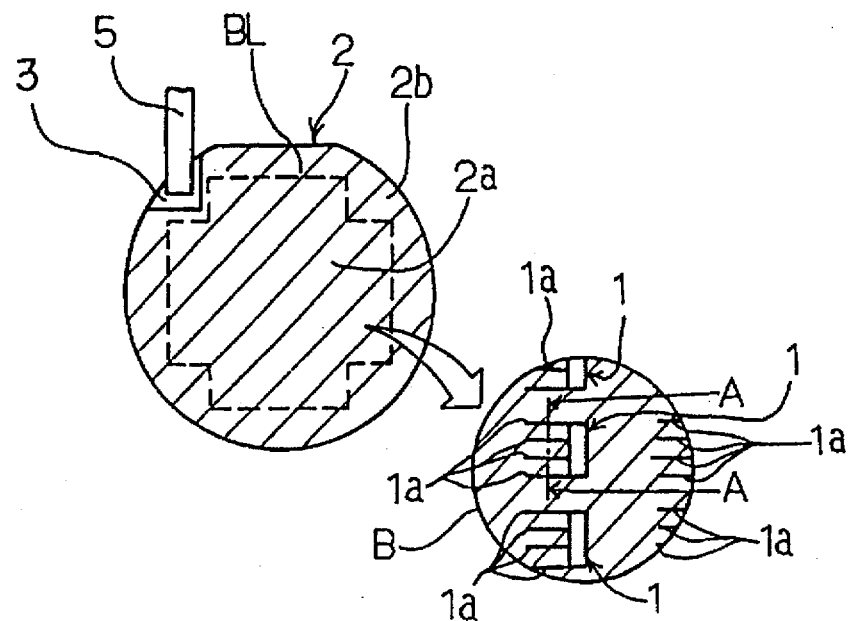
Fig. 1B
PRIOR ART
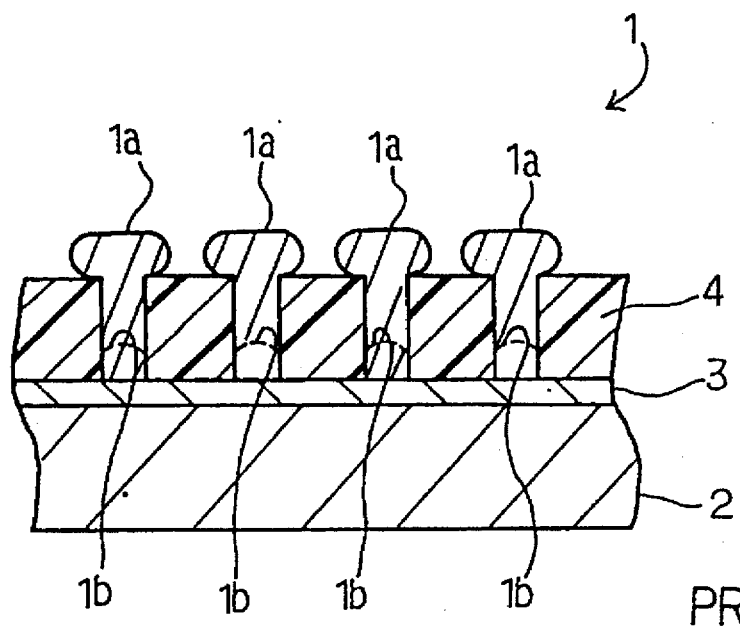
Fig. 2
PRIOR ART

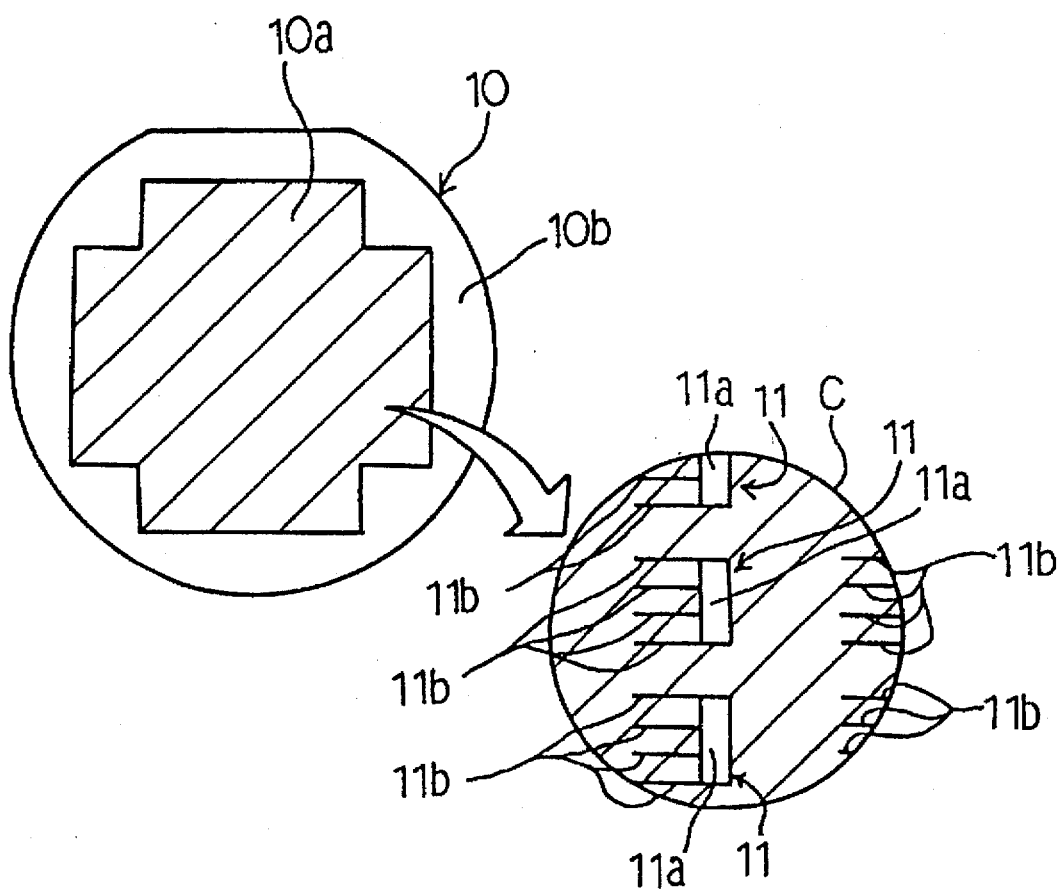

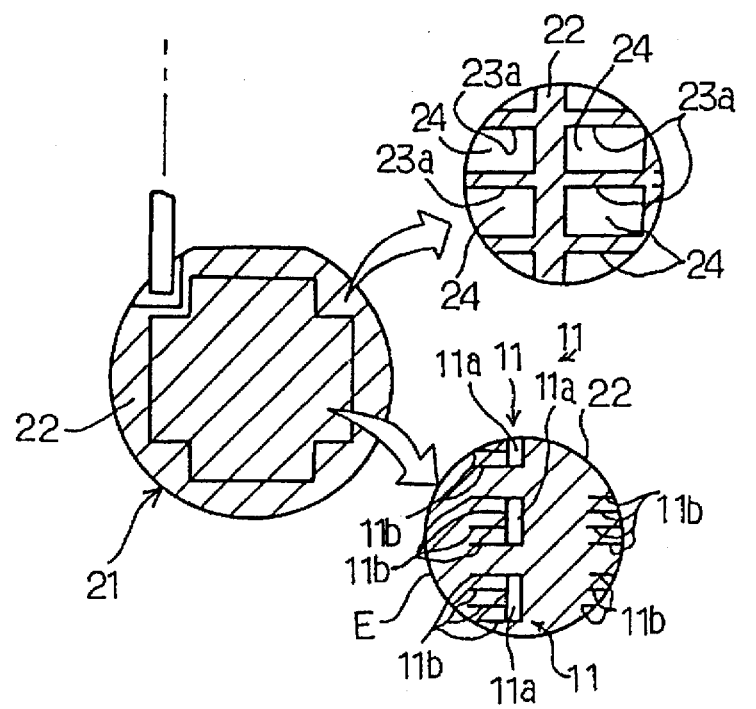
Fig. 5A
Fig. 5B
Fig. 5C
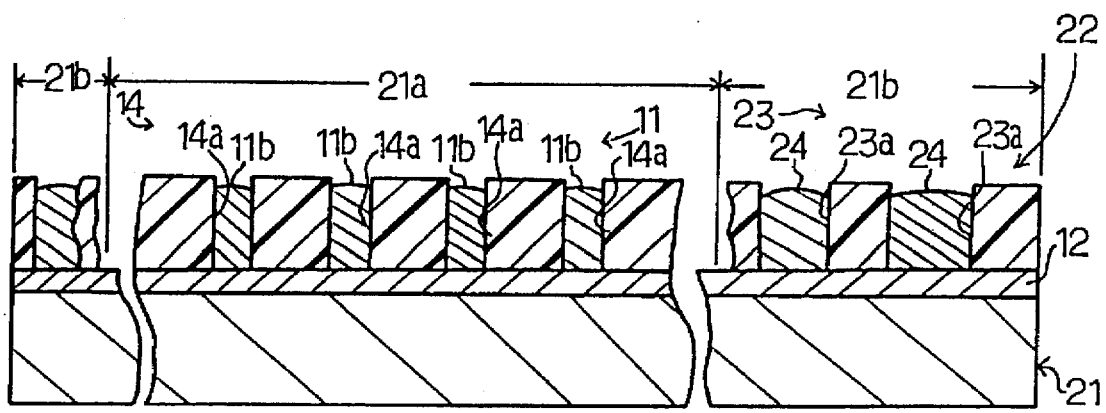
Fig. 6

PROCESS OF FORMING MINIATURE PATTERN WELL CONTROLLED IN THICKNESS ON SEMICONDUCTOR WAFER THROUGH SELECTIVE ELECTROPLATING

FIELD OF THE INVENTION

This invention relates to a process of fabricating a semiconductor device and, more particularly, to a process of forming a miniature pattern well controlled in thickness on a semiconductor wafer through selective electroplating.

DESCRIPTION OF THE RELATED ART

A miniature wiring pattern is formed on a semiconductor wafer for providing signal paths to integrated circuits. One of the patterning techniques for the miniature wiring pattern is selective electroplating. FIGS. 1 and 2 illustrate miniature wiring patterns or comblike gate electrode patterns 1 on a semiconductor wafer 2, and a narrow area of the semiconductor wafer 2 is enlarged in circle B.

A central area 2a of the semiconductor wafer is assigned to circuit components such as field effect transistors, and is indicated by broken line BL. On the other hand, a peripheral area 2b outside the broken line BL is not used for the circuit components. The comblike gate electrode patterns 1 are arranged in rows and columns in the central area 2a, and each of the comblike gate electrode pattern 1 has fingers 1a as narrow as 1 micron.

The comblike gate electrode patterns 1 are formed as follows. The prior art process starts with preparation of the semiconductor wafer 2, and the source/drain regions are formed in central area 2a. Titanium is sputtered to 50 nanometers thick on the semiconductor wafer 2, and platinum is further sputtered to 100 nanometers thick on the titanium film. The titanium film and the platinum film form in combination a conductive layer 3.

Photo-resist solution is spread over the conductive layer 3, and is patterned into a photo-resist mask 4. The photo-resist mask 4 exposes comblike narrow areas respectively assigned to the comblike gate electrode patterns 1 and a part of the peripheral area 2b for an electrode 5 of the electroplating system. The photo-resist mask 4 is hatched in FIG. 1 for easy discrimination.

The semiconductor wafer 2 is dipped into an electrolyte (not shown), and the electroplating system supplies electric current between the conductive layer 3 and a gold electrode (not shown). Then, gold grows on the comblike exposed areas, and the comblike gate electrode patterns 1 are formed on the conductive layer 3 in the matrix.

The amount of current I is calculating by using equation 1.

$$I = i \times S \qquad \text{Equation 1}$$

where S is the amount of area exposed to the electrolyte in square centimeter and i is the optimum current density in milli-ampere per square centimeter for creating a smooth surface. The optimum current density is constant, and is of the order of 1.5 milli-ampere per square centimeter.

The thickness d of the electroplating layer is in proportion to the product of the amount of current I and time t as shown in equation 2.

$$d = I \times t \qquad \text{Equation 2}$$

Thus, the electroplating is carried out by using the constant current I, and the thickness d is controlled with time t.

Upon completion of the electroplating, the photo-resist mask 4 is stripped off in organic solvent, and, thereafter, the conductive layer 3 is exposed among the comblike gate electrode patterns 1. The conductive layer 3 among the comblike gate electrode patterns 1 is removed from the semiconductor wafer 2 by using an ion milling. The exposed semiconductor wafer 2 and the comblike gate electrode patterns 1 are covered with an inter-level insulating layer (not shown).

Circuit components are getting smaller and smaller, and the prior art process encounters a problem in that the thickness d is uncontrollable. The dispersion of the thickness is more than 10 percent. Quickly grown comblike gate electrode patterns 1a project over the photo-resist mask 4, and slowly grown comblike gate electrode patterns are only left in the bottom portions of the photo-resist mask 4 as indicated by "1b". If the comblike gate electrode patterns 1a are different in thickness, the gate resistance is dispersed, and the transistor characteristics fluctuate.

SUMMARY OF THE INVENTION

It is therefore an important object of the present invention to provide a process of forming a miniature pattern the thickness of which is well controlled with time.

The present inventor contemplated the problem inherent in the miniature pattern formation, and noticed that unavoidable fluctuation in current strongly affected the electroplating in extremely narrow areas. In detail, the electric power source of the electroplating system unavoidably caused the current to fluctuate more than 10 percent with respect to the target value. If the exposed area S was wide, the amount of current I was large, and the fluctuation was negligible. However, the amount of exposed area had been decreased together with the device dimensions, and the exposed area S became extremely narrow. This meant that the fluctuation was never negligible, and the thickness d was dispersed due to the fluctuation of the current I.

To accomplish the object, the present invention proposes to expose not only a narrow area assigned to a miniature pattern but also a peripheral area not used for circuit components.

In accordance with the present invention, there is provided a process of forming a pattern on a semiconductor structure comprising the steps of: a) preparing a semiconductor structure having a surface imaginarily divided into a first area assigned to at least one integrated circuit and a second area left vacant; b) covering said first area and said second area with a conductive layer; c) forming a mask exposing parts of said conductive layer over said first area and another part of said conductive layer over said second area; d) selectively growing a substance on the exposed parts over the first area and said another part over the second area through electroplating; e) removing said mask from said conductive layer; and f) completing miniature patterns of the substance on said exposed parts.

The electroplating may be carried out by using a current that is at least ten times more than forecasted fluctuation of current of an electric power source incorporated in the electroplating system.

BRIEF DESCRIPTION OF THE DRAWINGS

The features and advantages of the process of forming a miniature wiring pattern according to the present invention will be more clearly understood from the following description taken in conjunction with the accompanying drawings in which:

FIG. 1 is a plan view showing the wiring pattern on the semiconductor wafer formed through the prior art electroplating process;

FIG. 2 is a cross sectional view taken along line A—A of FIG. 1 and showing the wiring pattern on the semiconductor wafer;

FIG. 3 is a plan view showing a semiconductor wafer on which circuit components are fabricated through a process according to the present invention;

FIG. 5 is a plan view showing another semiconductor wafer on which circuit components are fabricated through another process according to the present invention; and FIG. 6 is a cross sectional view showing a mask pattern formed over the semiconductor wafer.

DESCRIPTION OF THE PREFERRED EMBODIMENTS

First Embodiment

Figure 4A:
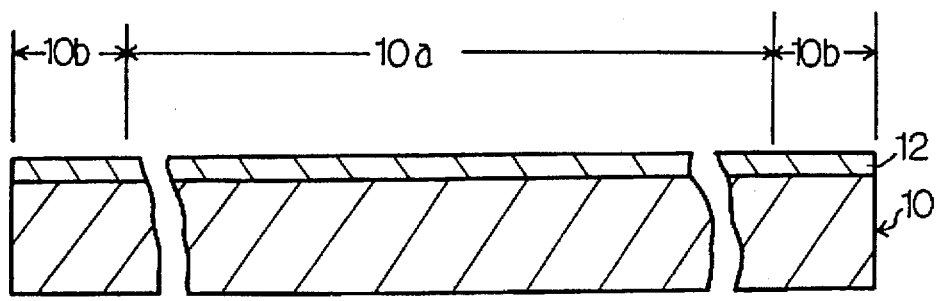
FIGS. 4A to 4F are cross sectional views showing the process sequence according to the present invention.

Referring to FIG. 3 of the drawings, a semiconductor wafer 10 has a surface imaginarily divided into a central area 10a assigned to integrated circuits and a vacant peripheral area 10b. The central area 10a is hatched for easy discrimination, and is further imaginarily divided into a plurality of pellets. The plurality of pellets are respectively assigned to the integrated circuits.

An extremely small part on the pellet is enlarged in circle C, and field effect transistors are incorporated in the integrated circuit on the extremely small part. The field effect transistors have respective comblike gate electrode patterns 11, and the comblike gate electrode patterns 11 are arranged in rows and columns. Each of the comblike gate electrode patterns has a boss portion 11a and fingers 11b, and the comblike gate electrode patterns 11 may be overlain by an inter-level insulating layer (not shown).

In this instance, the semiconductor wafer 10 is 3 inches or 7.5 centimeters in diameter, and the major surface of the semiconductor wafer 10 is 44.2 square centimeters in area. The central area 10a is about 80 percent of the major surface, and is about 35.36 square centimeters in area. The vacant peripheral area 10b is the difference between the major surface and the central area 10b, and is about 8.84 square centimeters in area.

The comblike gate electrode patterns 11 are formed through a process according to the present invention, and FIGS. 4A to 4F illustrate the process sequence. The process starts with preparation of the semiconductor wafer 10, and a thick field oxide layer and/or impurity regions are formed in the semiconductor wafer 10, if necessary.

Titanium is sputtered to 500 angstroms thick on the semiconductor wafer 10, and platinum is also sputtered to 1000 angstroms thick on the titanium film. The titanium film and the platinum film form in combination a conductive layer 12, and the conductive layer 12 covers both central and vacant peripheral areas 10a and 10b as shown in FIG. 4A.

Figure 4B:
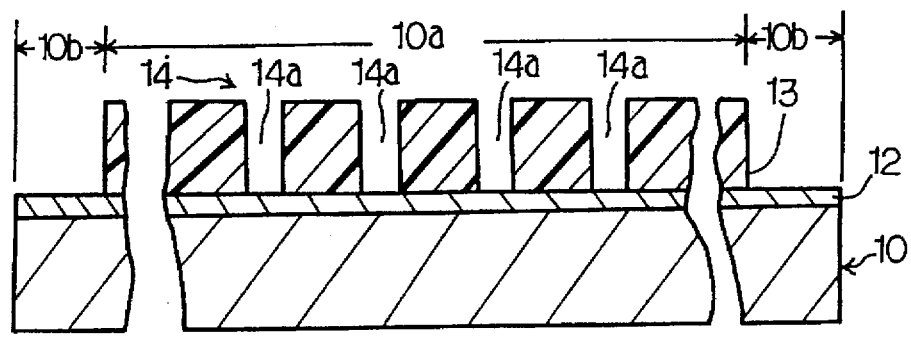

Photo-resist solution is spread over the entire surface of the conductive layer 12, and the photo-resist layer is patterned into a mask 13 through lithographic techniques as shown in FIG. 4B. Namely, the photo-resist layer is removed from the vacant peripheral area 10b, and hollow spaces 14 are formed in the photo-resist layer. The hollow space 14 is equivalent to the gate electrode pattern 11, and has finger-like slits 14a exposing the conductive layer 12. In this instance, the hollow spaces 14 occupy 2 percent of the central area 10a, and expose 0.707 square centimeters of the central area.

Figure 4C:
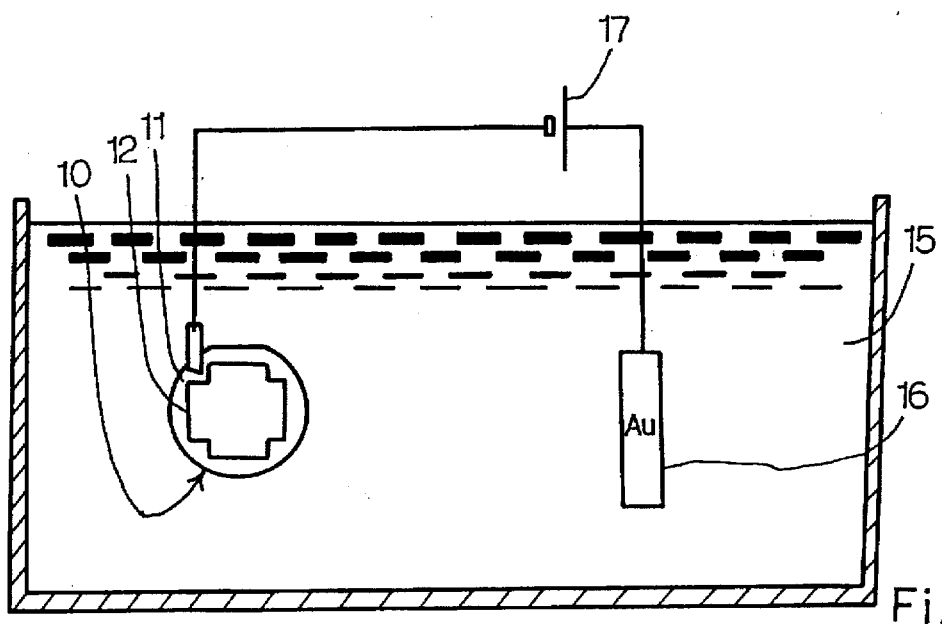
Figure 4D:
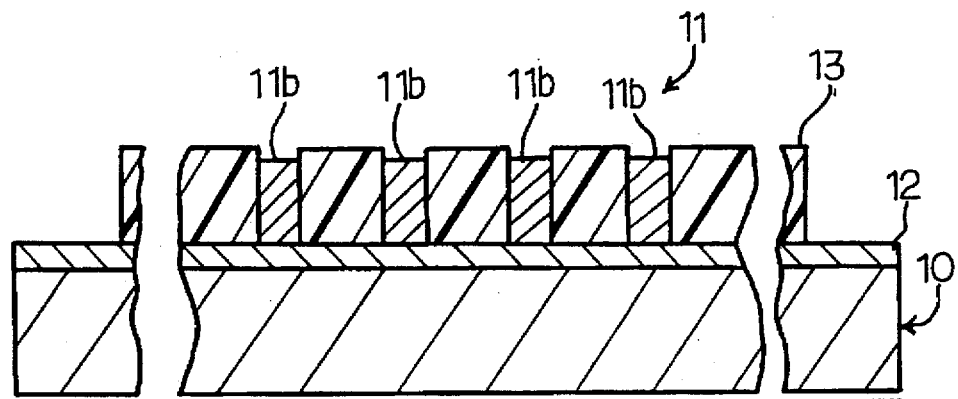

Subsequently, the semiconductor wafer 10 is dipped into electrolyte 15 together with gold electrode 16, and the conductive layer and the gold electrode 16 are connected to an electric power source 17 as shown in FIG. 4C. Current flows through the electrolyte 15 between the gold electrode 16 and the exposed conductive layer 12, and gold is grown on the exposed conductive layer 12. The gold forms the gate electrode patterns 11 as shown in FIG. 4D.

The electric power source 17 is assumed that the current fluctuates within 0.5 milli-ampere, and the current I between the gold electrode 16 and the conductive layer 12 is calculated by equation 3.

$$I = J \times (S1 + S2) = 1.5 \text{ (mA/cm}^2\text{)} \times (8.84 + 0.707) \quad \text{equation 3}$$
$$= 14.32 \text{ (mA)}$$

where J is the optimum current density, S1 is the area of the vacant peripheral area 10b and S2 is the part of the central area exposed to the hollow spaces 14. The current fluctuation is only 3.5 percent of the current I, and the dispersion in thickness of the gate electrode patterns is also 3.5 percent only.

If the mask 13 covers the vacant peripheral 10b as in the prior art process, the current I' is given as $$I' = J \times S2 = 1.5 \text{ (mA/cm}^2\text{)} \times 0.707 \text{ (cm}^2\text{)} \quad \text{equation 4}$$
$$= 1.061 \text{ (mA)}$$

The current fluctuation is of the order of ±50 percent, and the thickness is also dispersed at 50 percent.

It is understood that the exposed conductive layer 12 on the vacant peripheral area 10b is effective against the fluctuation of the thickness of the gate electrode patterns 11.

In this instance, the current I is about twenty nine times as large as the current fluctuation, and the ratio between the current I and the current fluctuation depends upon an allowable dispersion of the thickness of the gate electrode patterns 11 in view of the transistor characteristics. In general, it is preferable that the current I is at least ten times larger than the current fluctuation of the electric power source 17.

Figure 4E:
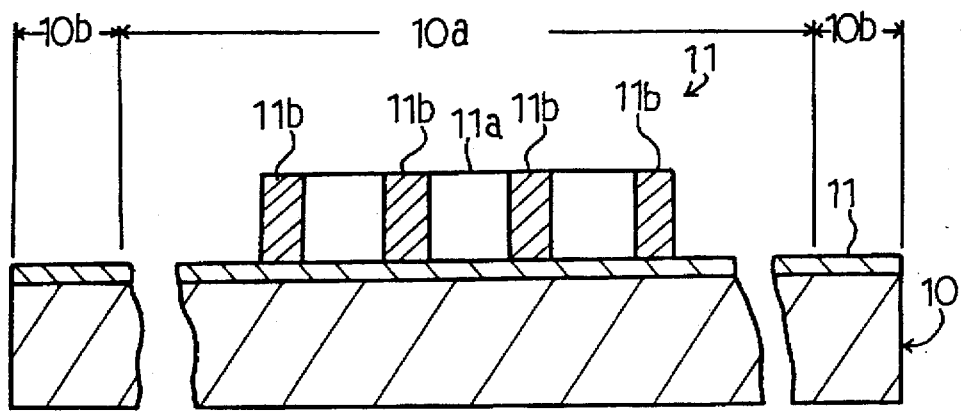

The mask 13 is stripped off, and the gate electrode patterns 11 are left on the conductive layer 11 over the central area 10a as shown in FIG. 4E.

Figure 4F:
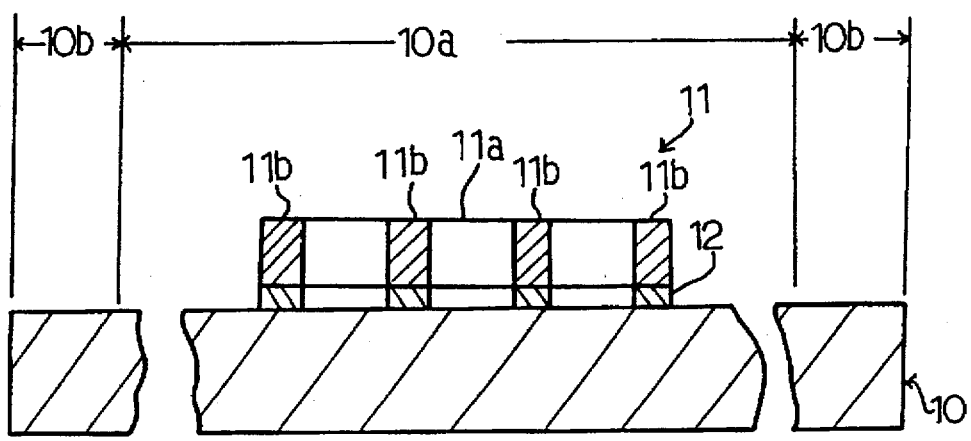

Finally, the exposed conductive layer 11 is removed by using an ion milling, and the gate electrode patterns 11 are completed on the central area 10b as shown in FIG. 4F.

The gate electrode patterns 11 may be covered with an inter-level insulating layer (not shown), and the integrated circuits are completed through necessary steps. The semiconductor wafer 10 is separated into the pellets, and the pellets are respectively sealed into suitable packages.

As will be appreciated from the foregoing description, the mask 13 uncovers the conductive layer 12 over the vacant peripheral area 10b and an increases the current during the electro-plating, and the large amount of current makes the unavoidable current fluctuation negligible. This results in uniform thickness of the gate electrode patterns 11, and the uniform gate electrode patterns 11 prevent the field effect transistors from rejection. As a result, the production yield of the integrated circuit devices is enhanced.

Second Embodiment

Another process embodying the present invention also starts with a semiconductor wafer 21, and the major surface of the semiconductor wafer 21 is imaginarily divided into a central area 21a and a vacant peripheral area 21b. The process implementing the second embodiment is similar to the first embodiment except for a pattern of a mask 22, and, for this reason, the description is focused on the mask 22 only. Members and parts corresponding to those of the first embodiment are labeled with the same reference numerals as those designating the corresponding members and parts without detailed description.

The conductive layer 12 is formed from a titanium film and a platinum film, and the mask 22 is patterned from a photo-resist layer through the lithographic techniques. The mask 22 is hatched in FIG. 5 so as to clearly understand the difference from the mask 13.

The mask 22 is provided on the entire surface of the conductive layer 12. The central portion of the mask 22 covers the conductive layer 12 over the central area 21a, and has an array of the comblike hollow spaces 14 as similar to the mask 13. On the other hand, the peripheral portion of the mask 22 covers the conductive layer 12 over the peripheral area 21b, and has a dummy pattern 23 or an array of rectangular hollow spaces 23a. The rectangular hollow spaces 23 expose the conductive layer 12, and gold 24 is grown on the conductive layer exposed to not only the comblike hollow spaces 14 formed in the central portion but also the rectangular hollow spaces 23 formed in the peripheral portion of the mask 22. The gold 24 in the comblike hollow spaces 14 forms the gate electrode patterns 11, and the gold 24 in the rectangular hollow space 23 form dummy gold pattern 24.

In this instance, the total area comblike/rectangular hollow spaces 14 and 23 is 7.5 percent of the entire surface of the conductive layer 12, and the current I is not less than ten times of the current fluctuation of the electric power source 17.

The ratio of the hollow spaces 23 to the peripheral portion of the mask 22 is regulated in such a manner as to cause the current I to be at least ten times as large as the current fluctuation. If the peripheral area 21b is relatively wide, the mask 22 effectively decreases the consumption of gold. Thus, the semiconductor manufacturer easily optimizes the exposed area of the conductive layer 12 by using the mask 22 having the dummy pattern 23.

The process implementing the second embodiment achieves all of the advantages of the present invention, and easily optimizes the total area of the exposed conductive layer.

Although particular embodiments of the present invention have been shown and described, it will be obvious to those skilled in the art that various changes and modifications may be made without departing from the spirit and scope of the present invention.

For example, the gate electrode patterns may be formed on an insulating layer covering a semiconductor wafer or semiconductor layers over the semiconductor wafer. In this instance, the semiconductor wafer/layers and the insulating layer as a whole constitute a semiconductor structure. The process according to the present invention is available for any metallic pattern such as, for example, wirings.

The growing substance is not limited to the gold. Another metal may be placed on the semiconductor structure.

What is claimed is:

1. A process of forming a pattern on a semiconductor structure comprising the steps of:
    a) preparing a semiconductor structure having a surface imaginarily divided into a first area containing at least one integrated circuit and a second area free of integrated circuits;
    b) covering the first area and the second area with a conductive layer;
    c) forming a mask exposing a part of the conductive layer over the first area and a part of the conductive layer over the second area;
    d) selectively growing a substance on the exposed part of the conductive layer over the first area and on the exposed part of the conductive layer over the second area by using electroplating wherein an amount of current flowing between the conductive layer and an electrode of an electroplating system is at least ten times larger than a current fluctuation of an electric power source of the electroplating system;
    e) removing the mask from the conductive layer; and
    f) completing miniature patterns of the substance on the exposed part of the conductive layer over the first area.

2. The process as set forth in claim 1, wherein the exposed part of the conductive layer over the second area covers an entire surface of the second area.

3. The process as set forth in claim 2, wherein the miniature patterns serve as gate electrode patterns for transistors forming parts of said at least one integrated circuit.

4. The process as set forth in claim 3, wherein said step f) of completing includes the step of forming the conductive layer into the gate electrode patterns by ion milling.

5. The process as set forth in claim 1, wherein the exposed part of the conductive layer over the second area covers a part of the second area, and the conductive layer over unexposed parts of the conductive layer over the second area is covered with the mask.

6. The process as set forth in claim 5, wherein a dummy pattern is formed in the mask to selectively expose the second area.

7. The process as set forth in claim 1, wherein the semiconductor structure is a semiconductor wafer.

8. The process as set forth in claim 1, wherein the first area is a central area and the second area is a peripheral area surrounding the central area.

9. A method of forming miniature patterns on a semiconductor structure having at least one integrated circuit, said method comprising the steps of:
    a) covering the semiconductor structure with a conductive layer;
    b) forming a mask having a first pattern to expose parts of the conductive layer corresponding to the miniature patterns and a second pattern to expose parts of the conductive layer not corresponding to any of the miniature patterns;
    c) selectively growing a substance on the exposed parts of the conductive layer by using electroplating;
    d) removing the mask from the conductive layer; and
    e) completing the miniature patterns,
    wherein, in said step b) of forming, the second pattern is designed in accordance with a relative size of a current that flows between the conductive layer and an electrode of an electroplating system with respect to a current fluctuation of an electric power source of the electroplating system.

10. The method as recited in claim 9, wherein the miniature patterns serve as gate electrode patterns for transistors forming parts of said at least one integrated circuit.

11. The method as recited in claim 10, wherein said step e) of completing includes the step of forming the conductive layer into the gate electrode patterns by ion milling.

12. The method as recited in claim 9, wherein a first imaginary area of said semiconductor structure includes said at least one integrated circuit and a second imaginary area of said semiconductor structure does not include any integrated circuits, and wherein the second pattern of the mask exposes substantially the entire second imaginary area.

13. The method as recited in claim 12, wherein the first imaginary area is a central area and the second imaginary area is a peripheral area surrounding the central area.

14. The method as recited in claim 9, wherein the semiconductor structure is a semiconductor wafer.

* * * * *